United States Patent
Liao et al.

(10) Patent No.: US 8,068,577 B2
(45) Date of Patent: Nov. 29, 2011

(54) PULL-DOWN CONTROL CIRCUIT AND SHIFT REGISTER OF USING SAME

(75) Inventors: Yi-Suei Liao, Hsinchu (TW); Jian-Hong Lin, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 0 days.

(21) Appl. No.: 12/565,226

(22) Filed: Sep. 23, 2009

(65) Prior Publication Data

US 2011/0069806 A1  Mar. 24, 2011

(51) Int. Cl.
*G11C 19/00* (2006.01)

(52) U.S. Cl. ............... 377/64; 377/68; 377/79

(58) Field of Classification Search ............ None
See application file for complete search history.

(56) References Cited

U.S. PATENT DOCUMENTS

| 7,283,603 | B1 * | 10/2007 | Chien et al. | 377/64 |
|---|---|---|---|---|
| 7,317,779 | B2 * | 1/2008 | Moon et al. | 377/64 |
| 7,778,379 | B2 * | 8/2010 | Liao et al. | 377/64 |
| 7,817,771 | B2 * | 10/2010 | Tsai et al. | 377/64 |
| 2006/0146978 | A1 * | 7/2006 | Jang | 377/64 |
| 2007/0001991 | A1 | 1/2007 | Jang et al. | |
| 2007/0086558 | A1 * | 4/2007 | Wei et al. | 377/64 |
| 2007/0104307 | A1 | 5/2007 | Kim et al. | |
| 2007/0217563 | A1 * | 9/2007 | Chang et al. | 377/64 |
| 2008/0001904 | A1 * | 1/2008 | Kim et al. | 345/100 |
| 2010/0150303 | A1 * | 6/2010 | Tsai et al. | 377/79 |

\* cited by examiner

*Primary Examiner* — Tuan T Lam

(74) *Attorney, Agent, or Firm* — Morris Manning & Martin LLP; Tim Tingkang Xia, Esq.

(57) ABSTRACT

The present invention relates to a pull-down control circuit and a shift register of using same. In one embodiment, the pull-down control circuit includes a release circuit and four transistors T4, T5, T6 and T7 electrically coupled to each other. The release circuit is adapted for causing the transistor T5 to be turned on and off alternately, thereby substantially reducing the stress thereon, improving the reliability and prolonging the lifetime of the shift register.

18 Claims, 11 Drawing Sheets

PULL-DOWN CONTROL CIRCUIT AND SHIFT REGISTER OF USING SAME

FIELD OF THE INVENTION

The present disclosure relates generally to a shift register, and more particularly, to a highly reliable pull-down control circuit and a shift register of using same.

BACKGROUND OF THE INVENTION

A liquid crystal display (hereinafter "LCD") includes an LCD panel formed with liquid crystal cells and pixel elements with each associating with a corresponding liquid crystal cell. These pixel elements are substantially arranged in the form of a matrix having gate lines in rows and data lines in columns. The LCD panel is driven by a driving circuit including a gate driver and a data driver. The gate driver generates a plurality of gate signals (scanning signals) sequentially applied to the gate lines for sequentially turning on the pixel elements row-by-row. The data driver generates a plurality of source signals (data signals), i.e., sequentially sampling image signals, simultaneously applied to the data lines in conjunction with the gate signals applied to the gate lines for aligning states of the liquid crystal cells on the LCD panel to control light transmittance therethrough, thereby displaying an image on the LCD.

In such a driving circuit, a shift register is utilized in the gate driver to generate the plurality of gate signals for sequentially driving the gate lines. To lower down costs, there have been efforts to integrate the shift register into an LCD panel. One of the efforts, for example, is to fabricate the shift register on a glass substrate of the LCD panel using an amorphous silicon thin film transistors (aSi TFTs), and/or low temperature polycrystalline silicon thin film transistors (LTPS TFTs).

FIG. 8 shows schematically a block diagram of an LCD 800 driven with data driver 811 and an a-Si shift register 812 having a plurality of stages S/R. The control signals 813 of the shift register includes six clock signals, CLK1, CLK2, . . . , and CLK6, a start signal, ST, applied to the first S/R stage, and a reference voltage, VSS. The shift register 812 is configured to generate a plurality of gate signals, G1, G2, . . . , Gi, according to the control signals 813 to activates pixels 814 in each row via the gate lines 815. The data driver 811 is configured to generate a plurality of data signals, D1, D2, . . . , Dj, an according to an image data, which is input to pixels 814 via data lines 816 to generate a corresponding display frame.

FIG. 9 shows a circuit diagram of a conventional a-Si shift register stage 900 having a pull-down control circuit 910. The pull-down control circuit 910 includes four transistors T4, T5, T6 and T7 electrically coupled to each other and is adapted for controlling the pull-down transistors T8 and T9. As shown in FIGS. 10 and 11, for such a configuration, in operation, the voltage difference, K(n)−P(n), between the voltages at the nodes K and P is periodically in a high voltage level for very long time. Accordingly, the transistor T5 is turned on for the durations of the high voltage level. However, when a high voltage is continually applied to the transistor T5 for a long period of time, the characteristics of the transistor T5 may deteriorate due to stress thereon and thus the transistor T5 may not function properly, thereby reducing the reliability of the shift register.

Therefore, a heretofore unaddressed need exists in the art to address the aforementioned deficiencies and inadequacies.

SUMMARY OF THE INVENTION

In one aspect, the present invention relates to a pull-down control circuit usable in a shift register. In one embodiment, the pull-down control circuit comprises a first input terminal for receiving a first control voltage, V1, a second input terminal for receiving a second control voltage, V2, a third input terminal for receiving a reference voltage, VSS, a release circuit having a first terminal electrically connected to the second input terminal, a second terminal electrically connected to a node, K, and a third terminal electrically connected to the third input terminal, and at least four transistors T4, T5, T6 and T7.

The transistor T4 has a gate electrically connected to the first terminal, a drain electrically connected to the gate, and a source electrically connected to the second terminal of the release circuit. The transistor T5 has a gate electrically connected to the node K, a drain electrically connected to the drain of the transistor T4, and a source electrically connected to a node, P. The transistor T6 has a gate electrically connected to a node, Q, a drain electrically connected to the node K, and a source electrically connected to the third terminal of the release circuit. The transistor T7 has a gate electrically connected to the gate of the transistor T6, a drain electrically connected to the node P, and a source electrically connected to the source of the transistor T6.

In one embodiment, the release circuit comprises a transistor T12 having a gate, a drain and a source electrically connected to the first terminal, the second terminal and the third terminal, respectively.

In another embodiment, the release circuit comprises three transistors T12, T13 and T14. The transistors T12 has a gate, a drain electrically connected to the second terminal, and a source electrically connected to the third terminal. The transistors T13 has a gate electrically connected to the first terminal, a drain electrically connected to the gate, and a source electrically connected to the gate of the transistor T12. The transistors T14 has a gate electrically connected to the first terminal, a drain electrically connected to the gate of the transistor T12, and a source electrically connected to the third terminal. At least one of the transistors T4-T6 and T12-14 comprises a MOS thin film transistor.

In one embodiment, the sum of the first control voltage V1, the second control voltage V2 and the reference voltage VSS satisfy the logic relationship of V1 AND V2 AND CLK(m)=0.

In another aspect, the present invention relates to a shift register having a plurality of stages. Each stage includes a pull-down control circuit as disclosed above.

In yet another aspect, the present invention relates to a pull-down control circuit usable in a shift register. In one embodiment, the pull-down control circuit comprises an input circuit electrically coupled to a first control voltage, V1, a release circuit electrically coupled to the input circuit, a second control voltage, V2, and the reference voltage, VSS, a pull-down circuit electrically coupled to the input circuit and the release circuit, and an output circuit electrically coupled to the input circuit and the pull-down circuit.

In one embodiment, the first control voltage V1, the second control voltage V2 and the reference voltage VSS satisfy the logic relationship of V1 AND V2 AND CLK(m)=0.

In one embodiment, the input circuit comprises a transistor T4 having a gate electrically coupled to the first control voltage V1, a drain electrically connected to the gate, and a source eclectically connected to a node, K. The pull-down circuit comprises a transistor T6 having a gate electrically connected to a node, Q, a drain electrically connected to the node K, and a source electrically coupled to the release circuit. The output circuit comprises a transistor T5 having a gate electrically connected to the node K, a drain electrically connected to the drain of the transistor T4, and a source electrically connected to a node, P, and a transistor T7 having a gate electrically connected to the gate of the transistor T6, a drain electrically connected to the node P, and a source electrically connected to the source of the transistor T6.

In one embodiment, the release circuit comprises a transistor T12 having a gate electrically coupled to the second control voltage V2, a drain electrically connected to the source of the transistor T4 and a source electrically coupled to the reference voltage VSS. In another embodiment, the release circuit comprises three transistors T12, T13 and T14, where the transistors T12 has a gate, a drain electrically connected to the source of the transistor T4, and a source electrically coupled to the reference voltage VSS; the transistors T13 has a gate electrically coupled to the second control voltage V2, a drain electrically connected to the gate, and a source electrically connected to the gate of the transistor T12; and the transistors T14 has a gate electrically coupled to the second control voltage V2, a drain electrically connected to the gate of the transistor T12, and a source electrically coupled to the reference voltage VSS In a further aspect, the present invention relates to a shift register comprising a plurality of stages, wherein each stage comprises the pull-down control circuit as disclosed above.

In yet a further aspect, the present invention relates to a shift register. In one embodiment, the shift register includes a plurality of stages, {$S_n$}, n=1, 2, ..., N, N being a positive integer.

Each stage $S_n$ has a first input, IN1, for receiving a first control signal, V1, a second input, IN2, for receiving a second control signal, V2, a third input, IN3, for receiving a third control signal, V3, a fourth input, IN4, for receiving a fourth control signal, V4, a fifth input, IN5, for receiving the fifth control signal, V5, a sixth input, IN6, for receiving a pull-up output signal, F(n−1), of the stage $S_{n-1}$, a seventh input, IN7, for receiving an output signal, G(n+1), of the stage $S_{n+2}$, a first output, OUT1, for outputting an output signal, G(n), a second output, OUT2, for outputting a pull-up output signal, F(n).

Further, each stage $S_n$ has a first transistor T1, a second transistor T2 and a third transistor T3. The first transistor T1 has a gate electrically connected to the sixth input IN6, a drain electrically connected to a node, Q, and a source electrically connected to the gate. The second transistor T2 has a gate electrically connected to the node Q, a drain electrically connected to the fourth input IN4, and a source electrically connected to the second output OUT2. The third transistor T3 has a gate electrically connected to the gate of the second transistor T2, a drain electrically connected to the fifth input IN5, and a source electrically connected to the first output OUT1.

Each stage $S_n$ also has a pull-down control circuit having a fourth transistor T4, a fifth transistor T5, a sixth transistor T6, a seventh transistor T7 and a release circuit electrically coupled to each other. The release circuit has a first terminal electrically connected to the second input IN2, a second terminal electrically connected to a node, K, and a third terminal electrically connected to the third input IN3. The fourth transistor T4 has a gate electrically connected to the first input IN1, a drain electrically connected to the gate, and a source electrically connected to the second terminal of the release circuit. The fifth transistor T5 has a gate electrically connected to the node K, a drain electrically connected to the drain of the fourth transistor T4, and a source electrically connected to a node, P. The sixth transistor T6 has a gate electrically connected to a node, Q, a drain electrically connected to the node K, and a source electrically connected to the third terminal of the release circuit. The seventh transistor T7 has a gate electrically connected to the gate of the sixth transistor T6, a drain electrically connected to the node P, and a source electrically connected to the source of the sixth transistor T6.

Additionally, each stage $S_n$ has an eighth transistor T8, a ninth transistor T9, a tenth transistor T10, an eleventh transistor T11 and a capacitor. The eighth transistor T8 having a gate electrically connected to the node P, a drain electrically connected to the drain of the first transistor T1, and a source electrically connected to the source of the seventh transistor T7. The ninth transistor T9 having a gate electrically connected to the gate of the eighth transistor T8, a drain electrically connected to the first output OUT1, and a source electrically connected to the source of the eighth transistor T8. The tenth transistor T10 having a gate electrically connected to the seventh input IN7, a drain electrically connected to the gate of third transistor T3, and a source electrically connected to the source of the ninth transistor T9. The eleventh transistor T11 having a gate electrically connected to the gate of the tenth transistor T10, a drain electrically connected to the first output OUT1, and a source electrically connected to the source of the tenth transistor T10. The capacitor having one terminal electrically connected to the node Q and the other terminal electrically connected to the drain of the ninth transistor T9.

In one embodiment, the plurality of stages {$S_n$} is electrically coupled to each other in serial such that the six input IN6 of the n-th stage $S_n$ is electrically connected to the second output OUT2 of the (n−1)-th stage $S_{n-1}$, for receiving a corresponding pull-up output signal F(n−1) therefrom, and the seventh input IN7 of the n-th stage $S_n$ is electrically connected to the first output OUT1 of the (n+2)-th stage $S_{n+2}$, for receiving a corresponding output signal G(n+2) therefrom.

In one embodiment, the release circuit comprises a twelfth transistor T12 having a gate, a drain and a source electrically connected to the first terminal, the second terminal and the third terminal, respectively. In another embodiment, the release circuit comprises a twelfth transistor T12, a thirteenth transistor T13, and a fourteenth transistor T14. The twelfth transistors T12 has a gate, a drain electrically connected to the second terminal, and a source electrically connected to the third terminal. The thirteenth transistors T13 has a gate electrically connected to the first terminal, a drain electrically connected to the gate, and a source electrically connected to the gate of the transistor T12. The fourteenth transistors T14 has a gate electrically connected to the first terminal, a drain electrically connected to the gate of the transistor T12, and a source electrically connected to the third terminal. At least one of the first through fourteenth transistors T1-14 comprises a MOS thin film transistor.

In one embodiment, the third control signal V3 is a reference voltage VSS. Each of the first control signal V1, the second control signal V2, the fourth control signal V4, and the fifth control signal V5 is a corresponding one of a plurality of clock signals, {CLK(m)}, m being an integer greater than one.

In one embodiment, each of the plurality of clock signals {CLK(m)} is characterized with a high voltage level and a low voltage level alternately in a frequency.

In one embodiment, the fourth control signal V4 and the fifth control signal V5 are substantially identical to each other.

In one embodiment, the sum of the first control voltage V1, the second control voltage V2 and the supply voltage VSS satisfy the logic relationship of V1 AND V2 AND CLK (m)=0.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
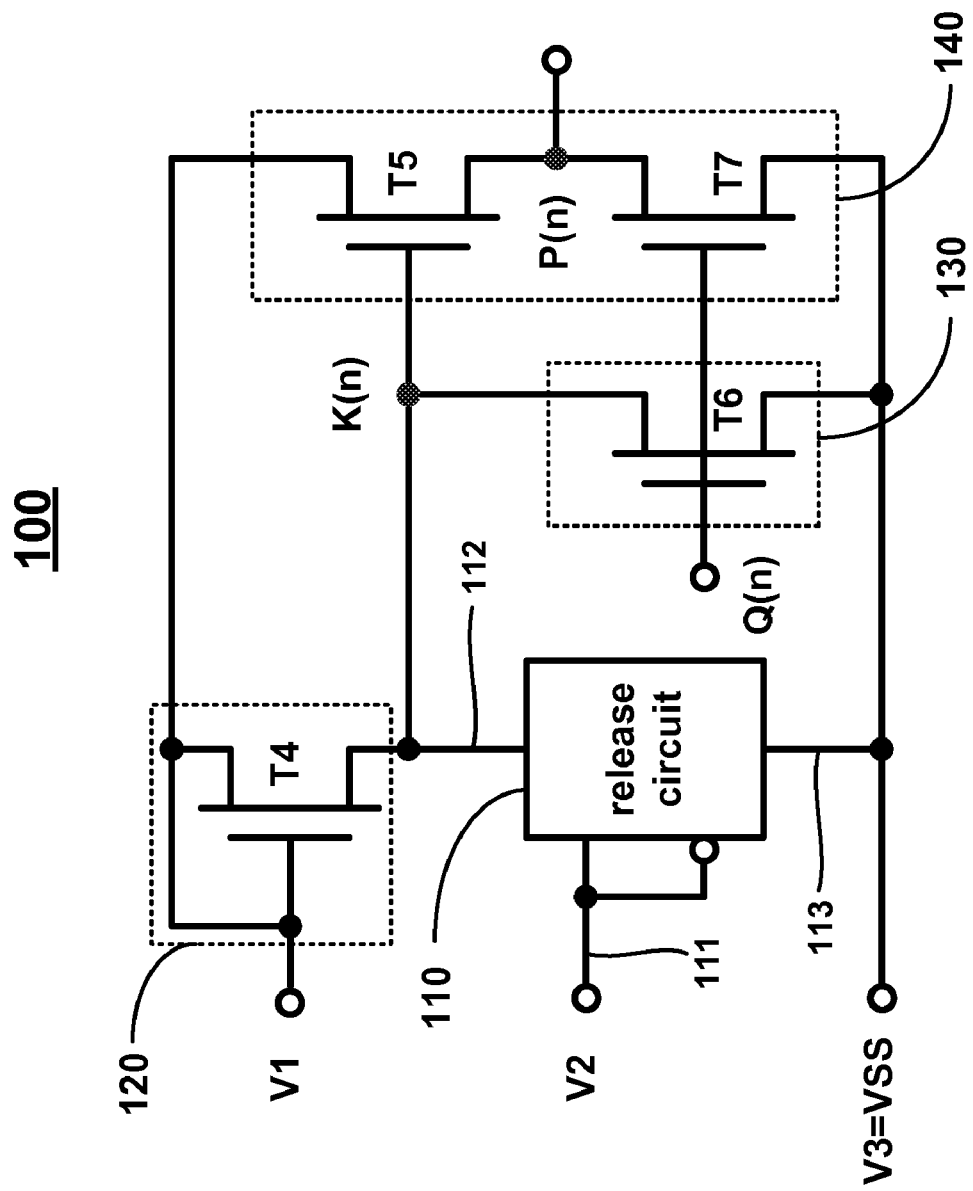
FIG. 1 shows a circuit diagram of a pull-down control circuit according to one embodiment of the present invention.
Figure 2:
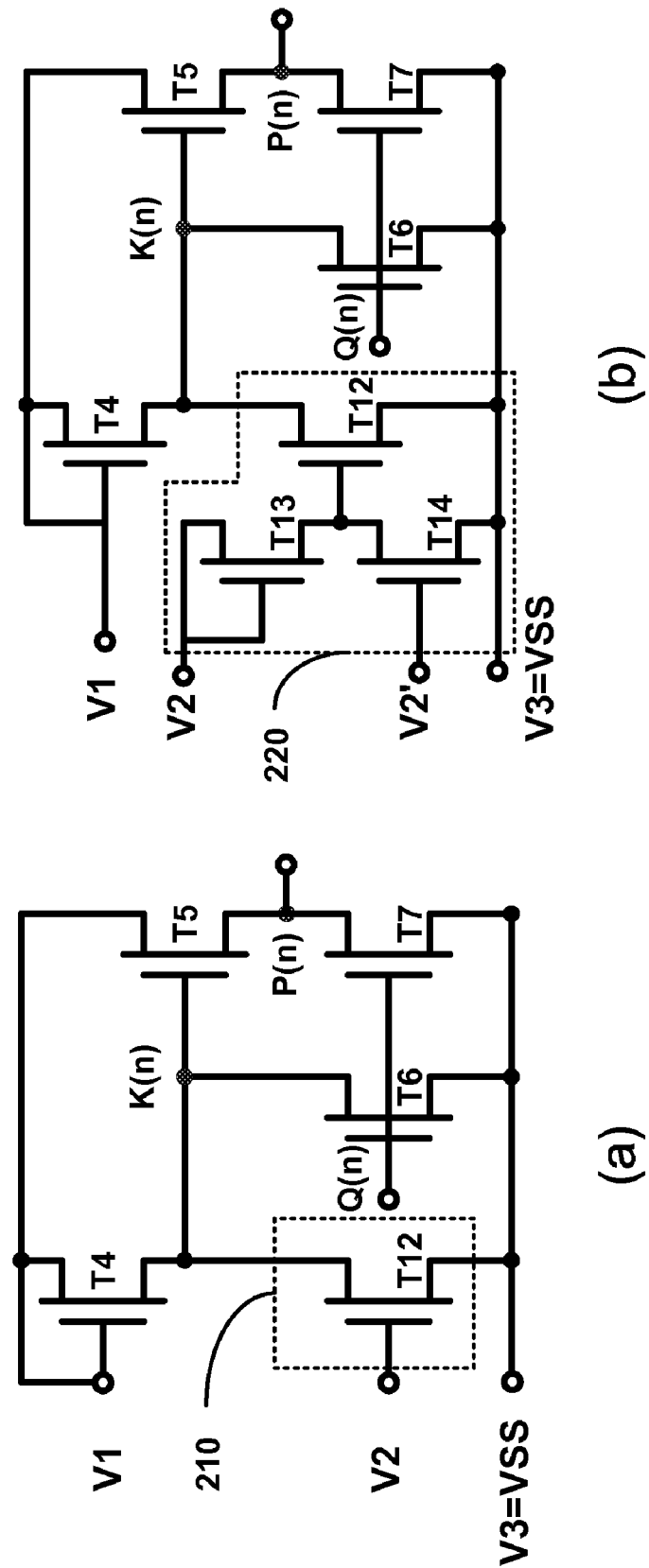
FIG. 2 shows circuit diagrams of two pull-down control circuits, (a) according to one embodiment of the present invention, and (b) according to another embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "having," "containing," "involving," and the like are to be understood to be open-ended, i.e., to mean including but not limited to.

The description will be made as to the embodiments of the present invention in conjunction with the accompanying drawings in FIGS. 1-7. In accordance with the purposes of this disclosure, as embodied and broadly described herein, this disclosure, in one aspect, relates to a highly reliable pull-down control circuit and a shift register of using same.

Referring now to FIG. 1, a pull-down control circuit usable in a shift register is shown according to one embodiment of the present invention. The pull-down control circuit comprises a first input terminal for receiving a first control voltage, V1, a second input terminal for receiving a second control voltage, V2, a third input terminal for receiving a reference voltage, VSS, a release circuit 110 having a first terminal 111 electrically connected to the second input terminal, a second terminal 112 electrically connected to a node, K(n), and a third terminal 113 electrically connected to the third input terminal, and at least four transistors T4, T5, T6 and T7.

According to the present invention, the first control voltage V1, the second control voltage V2 and the reference voltage VSS satisfy the logic relationship of V1 AND V2 AND CLK (m)=0

The transistor T4 has a gate electrically connected to the first terminal, a drain electrically connected to the gate, and a source electrically connected to the second terminal 112 of the release circuit 110. The transistor T5 has a gate electrically connected to the node K(n), a drain electrically connected to the drain of the transistor T4, and a source electrically connected to a node, P. The transistor T6 has a gate electrically connected to a node, Q(n), a drain electrically connected to the node K(n), and a source electrically connected to the third terminal 113 of the release circuit 110. The transistor T7 has a gate electrically connected to the gate of the transistor T6, a drain electrically connected to the node P, and a source electrically connected to the source of the transistor T6.

As shown in FIG. 2(a), the release circuit 210 in this exemplary embodiment includes a transistor T12 having a gate, a drain and a source electrically connected to the second input terminal of the pull-down control circuit, the source of the transistor T4, and the reference voltage VSS, respectively.

FIG. 2(b) shows another embodiment of the release circuit 220 that has three transistors T12, T13 and T14. The transistors T12 has a gate, a drain electrically connected to the source of the transistor T4, and a source electrically connected to the reference voltage VSS. The transistors T13 has a gate electrically connected to the second input terminal of the pull-down control circuit, a drain electrically connected to the gate, and a source electrically connected to the gate of the transistor T12. The transistors T14 has a gate electrically connected to the second input terminal of the pull-down control circuit a drain electrically connected to the gate of the transistor T12, and a source electrically connected to the reference voltage VSS.

Additionally, as shown in FIG. 1, the pull-down control circuit 100 can also be characterized in that an input circuit 120 is electrically coupled to the first control voltage V1, a release circuit 110 is electrically coupled to the input circuit 120, a second control voltage V2 and the reference voltage VSS, a pull-down circuit 130 is electrically coupled to the input circuit 120 and the release circuit 110, and an output circuit 140 electrically coupled to the input circuit 120 and the pull-down circuit 130.

As shown in FIG. 1, the input circuit 120 has a transistor T4 having a gate electrically coupled to the first control voltage V1, a drain electrically connected to the gate, and a source eclectically connected to a node, K(n). The pull-down circuit 130 has a transistor T6 having a gate electrically connected to a node, Q(n), a drain electrically connected to the node K, and a source electrically coupled to the release circuit 110. The output circuit 140 has a transistor T5 having a gate electrically connected to the node K(n), a drain electrically connected to the drain of the transistor T4, and a source electrically connected to a node, P, and a transistor T7 having a gate electrically connected to the gate of the transistor T6, a drain electrically connected to the node P(n), and a source electrically connected to the source of the transistor T6.

The release circuit 110 includes a transistor T12, as shown in FIG. 2(a) or three transistors T12, T13 and T14, as shown in FIG. 2(b).

In one aspect, the present invention relates to a shift register having a plurality of stages, $\{S_n\}$, electrically coupled to each other in serial, where n=1, 2, ..., N, N being positive integer. Each shift register stage $S_n$ has an identical circuit diagram.

Figure 3:
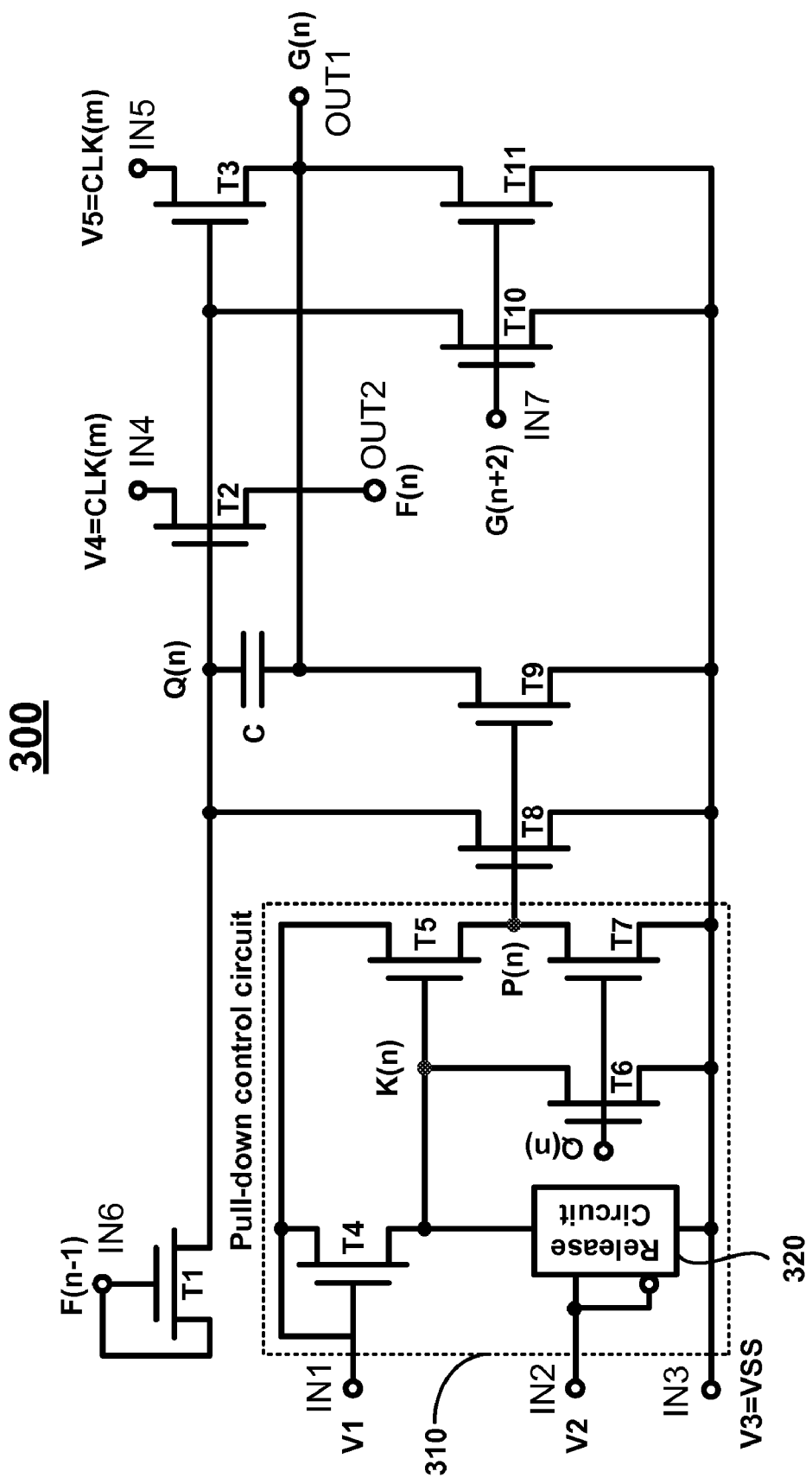
FIG. 3 shows a circuit diagram of a shift register stage according to one embodiment of the present invention.

Referring to FIG. 3, the shift register stage ($S_n$) 300 is shown according to one embodiment of the present invention. The shift register stage ($S_n$) 300 has a first input, IN1, for receiving a first control signal, V1, a second input, IN2, for receiving a second control signal, V2, a third input, IN3, for receiving a third control signal, V3, a fourth input, IN4, for receiving a fourth control signal, V4, a fifth input, IN5, for receiving the fifth control signal, V5, a sixth input, IN6, for receiving a pull-up output signal, F(n−1), of the shift register stage $S_{n−1}$, a seventh input, IN7, for receiving an output signal, G(n+1), of the shift register stage $S_{n+2}$, a first output, OUT1, for outputting an output signal, G(n), a second output, OUT2, for outputting a pull-up output signal, F(n).

Further, the shift register stage 300 has a first transistor T1, a second transistor T2 and a third transistor T3. The first transistor T1 has a gate electrically connected to the sixth input IN6, a drain electrically connected to a node, Q(n), and a source electrically connected to the gate. The second transistor T2 has a gate electrically connected to the node Q(n), a drain electrically connected to the fourth input IN4, and a source electrically connected to the second output OUT2. The third transistor T3 has a gate electrically connected to the gate of the second transistor T2, a drain electrically connected to the fifth input IN5, and a source electrically connected to the first output OUT1.

The shift register stage 300 also has a pull-down control circuit 310 having a fourth transistor T4, a fifth transistor T5, a sixth transistor T6, a seventh transistor T7 and a release circuit 320 electrically coupled to each other. The release circuit 320 has a first terminal electrically connected to the second input IN2, a second terminal electrically connected to a node, K(n), and a third terminal electrically connected to the third input IN3. The fourth transistor T4 has a gate electrically connected to the first input IN1, a drain electrically connected to the gate, and a source electrically connected to the second terminal of the release circuit. The fifth transistor T5 has a gate electrically connected to the node K(n), a drain electrically connected to the drain of the fourth transistor T4, and a source electrically connected to a node, P(n). The sixth transistor T6 has a gate electrically connected to a node, Q(n), a drain electrically connected to the node K(n), and a source electrically connected to the third terminal of the release circuit. The seventh transistor T7 has a gate electrically connected to the gate of the sixth transistor T6, a drain electrically connected to the node P(n), and a source electrically connected to the source of the sixth transistor T6.

As shown in FIG. 3, the shift register stage 300 further has an eighth transistor T8, a ninth transistor T9, a tenth transistor T10, an eleventh transistor T11 and a capacitor C. The eighth transistor T8 having a gate electrically connected to the node P(n), a drain electrically connected to the drain of the first transistor T1, and a source electrically connected to the source of the seventh transistor T7. The ninth transistor T9 having a gate electrically connected to the gate of the eighth transistor T8, a drain electrically connected to the first output OUT1, and a source electrically connected to the source of the eighth transistor T8. The tenth transistor T10 having a gate electrically connected to the seventh input IN7, a drain electrically connected to the gate of third transistor T3, and a source electrically connected to the source of the ninth transistor T9. The eleventh transistor T11 having a gate electrically connected to the gate of the tenth transistor T10, a drain electrically connected to the first output OUT1, and a source electrically connected to the source of the tenth transistor T10. The capacitor C having one terminal electrically connected to the node Q(n) and the other terminal electrically connected to the drain of the ninth transistor T9.

Figure 5:
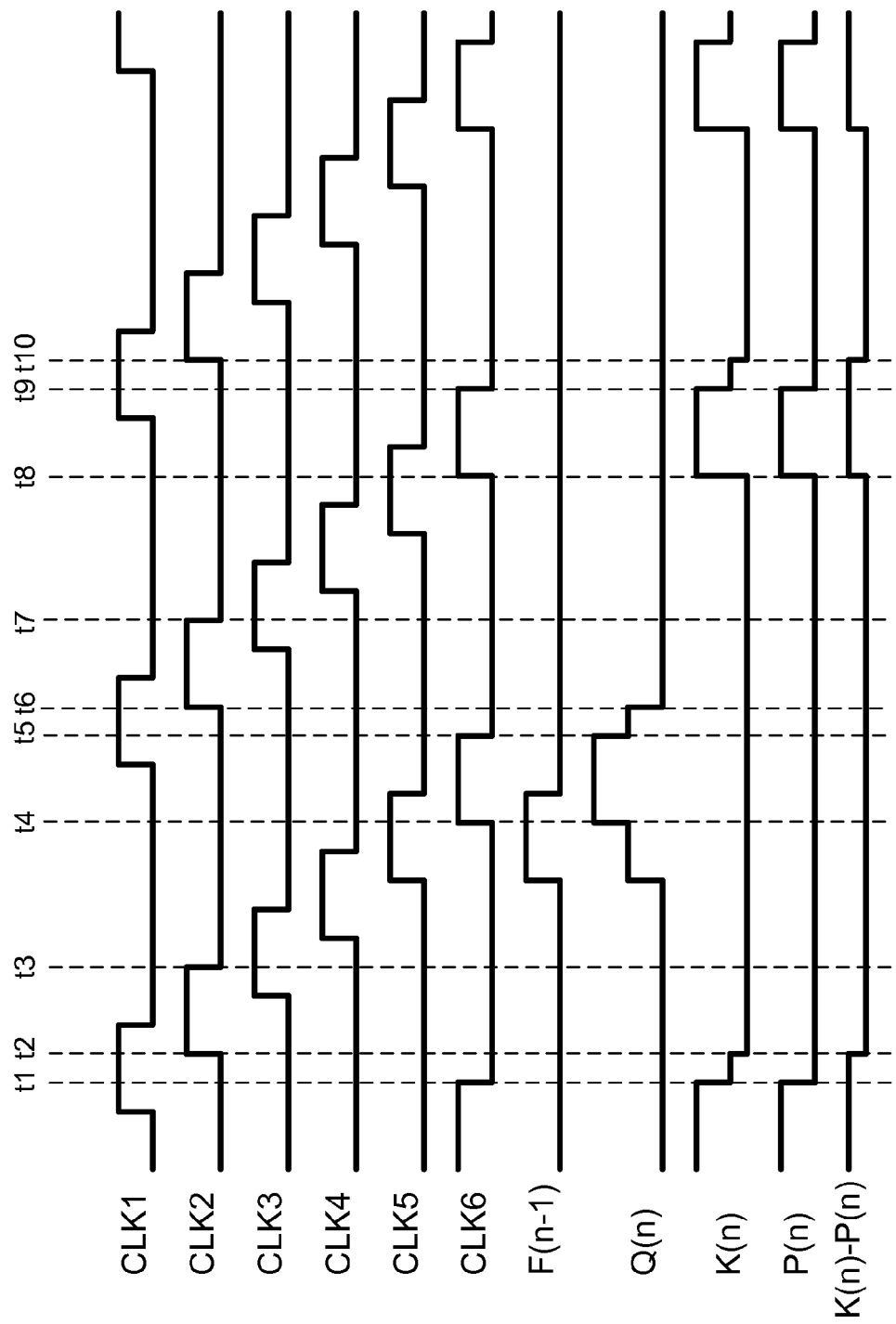
FIG. 5 shows a timing chart of the shift register stage shown in FIG. 4.
Figure 6:
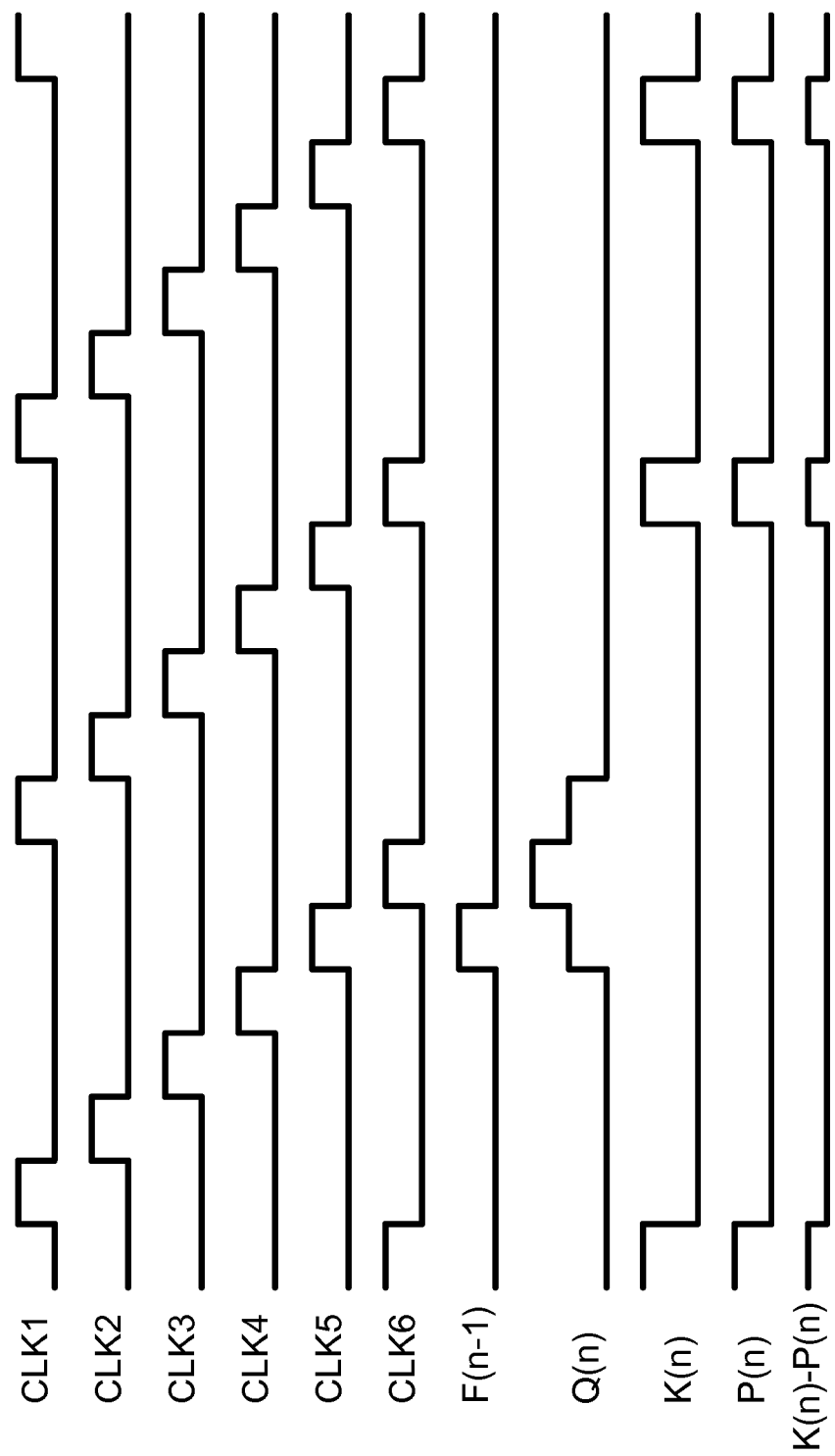
FIG. 6 shows another timing chart of the shift register stage shown in FIG. 4.

As shown in FIG. 3, the third control signal V3 is a reference voltage VSS. Each of the first control signal V1, the second control signal V2, the fourth control signal V4, and the fifth control signal V5 is a corresponding one of a plurality of clock signals, $\{CLK(m)\}$, m being an integer greater than one. In the following exemplary embodiment as shown in FIGS. 5 and 6, the plurality of clock signals $\{CLK(m)\}$ includes six (m=6) clock signals, CLK(1)=CLK1, CLK(2)=CLK2, ..., and CLK(6)=CLK6. Each clock signal is characterized with a high voltage level and a low voltage level alternately in a frequency. According to the present invention, V4=V5=CLK(m), and V1, V2 and VSS satisfy the logic relationship of V1 AND V2 AND CLK(m)=0 In FIG. 5, V1=CLK(6), and V2=CLK(2). Whereas V1=CLK(6), and V2=CLK(1) in the embodiment shown in FIG. 6.

For the shift register 300, the plurality of shift register stages $\{S_n\}$ is electrically coupled to each other in serial such that the six input IN6 of the n-th stage $S_n$ is electrically connected to the second output OUT2 of the (n−1)-th shift register stage $S_{n−1}$, for receiving a corresponding pull-up output signal F(n−1) therefrom, and the seventh input IN7 of the n-th stage $S_n$ is electrically connected to the first output OUT1 of the (n+2)-th shift register stage $S_{n+2}$, for receiving a corresponding output signal G(n+2) therefrom.

Figure 4:
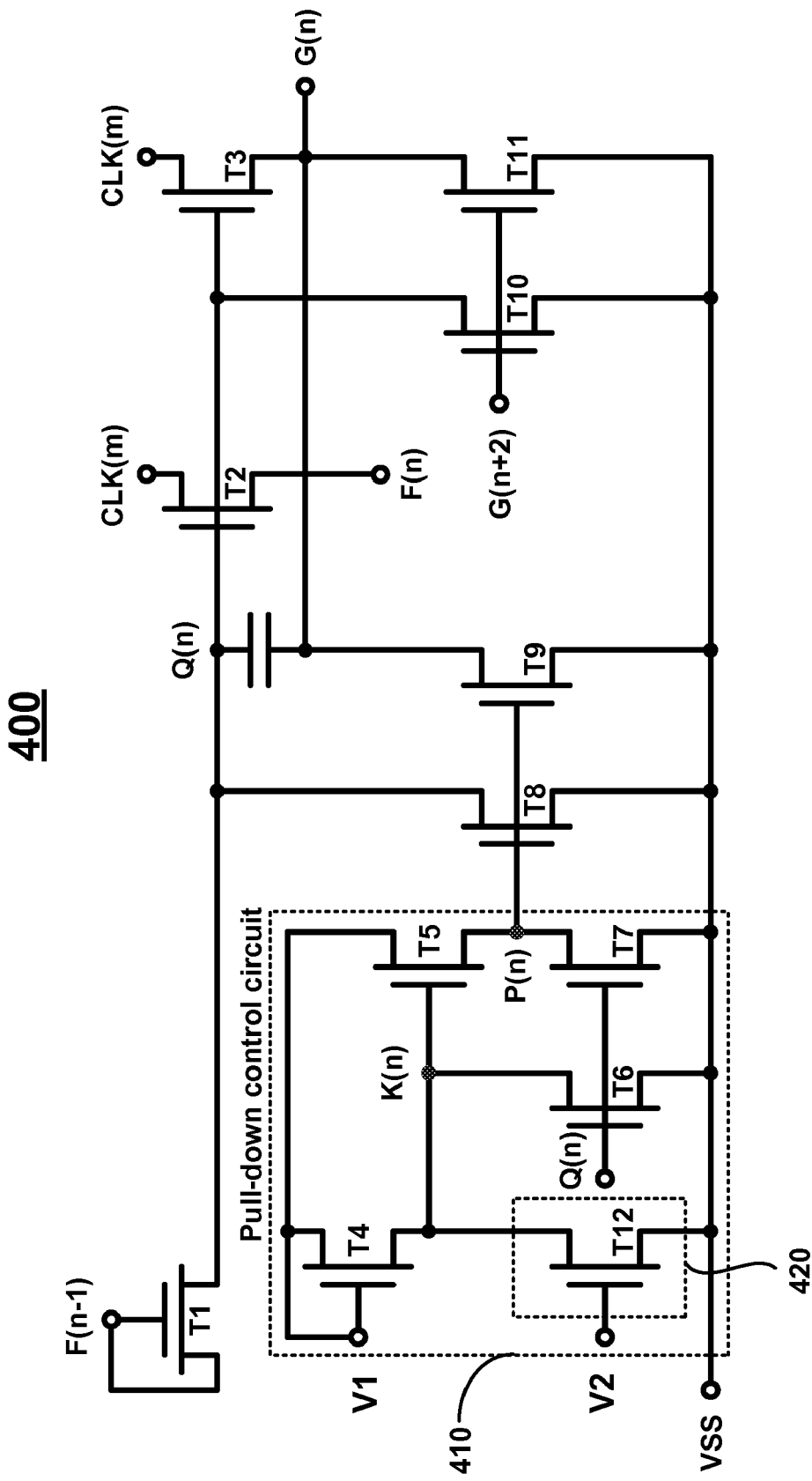
FIG. 4 shows a circuit diagram of a shift register stage according to another embodiment of the present invention.

Referring to FIG. 4, a shift register stage 400 is shown according to another embodiment of the present invention. Similar to the shift register stage 300 shown in FIG. 3, the shift register stage 400 also has a pull-down control circuit 410 that includes a release circuit 420. In the exemplary embodiment, the release circuit 420 has a twelfth transistor T12 having a gate, a drain and a source electrically connected to the second input IN2, the source of the fourth transistor T4, and the reference voltage VSS, respectively.

Referring to FIG. 5 now, timing charts of the shift register stage $S_n$, as shown in FIG. 4, are shown. In the exemplary embodiment, six clock signals, CLK(1)=CLK1, CLK(2)=CLK2, ..., and CLK(6)=CLK6 are utilized. V4=V5=CLK(m), V1=CLK(6), and V2=CLK(2). Further, V1, V2 and VSS satisfy the logic relationship of V1 AND V2 AND CLK(m)=0 Additionally, F(n−1) represents the pull-up output voltage from the immediately prior shift register stage. Q(n), K(n) and P(n) are the voltages at the nodes Q, K and P, respectively.

K(n)−P(n) is the voltage difference between the nodes K and P in the pull-down control circuit.

At time t1, CLK6 changes from its high voltage level to its low voltage level, which turns the fourth transistor T4 from on to off. Meanwhile, CLK2 is in its low voltage level, indicating that the release circuit (the twelfth transistor T12) is the off state. Accordingly, the voltage K(n) at the node K and the voltage P(n) at the node P are simultaneously drops from a high voltage level to a low voltage level.

At time t2, CLK2 changes from its low voltage level to its high voltage level, and CLK6 is still in its low voltage level. Accordingly, the release circuit (the twelfth transistor T12) is turned on, while the fourth transistor T4 is still in the off state, which causes the voltage K(n) at the node K to further drop to a lower level.

At time t3, CLK2 changes from its high voltage level to its low voltage level, and CLK6 is still in its low voltage level. Accordingly, the release circuit (the twelfth transistor T12) is turned off, while the fourth transistor T4 is still in the off state. In the case, both the voltage K(n) at the node K and the voltage P(n) at the node P are in their low level.

At time t4, CLK6 changes from its low voltage level to its high voltage level, which turns the fourth transistor T4 from off to on, and CLK2 is still in its low voltage level, indicating that the twelfth transistor T12 is the off state. However, at this time, the voltage Q(n) at the node Q is in its highest voltage level, which turns both the sixth and seventh transistors T6 and T7 on. Accordingly, the voltage K(n) at the node K and the voltage P(n) at the node P are discharged through the sixth and seventh transistors T6 and T7, respectively.

At time t5, CLK6 changes from its high voltage level to its low voltage level, which turns the fourth transistor T4 from on to off, and CLK2 is still in its low voltage level, indicating that the twelfth transistor T12 is the off state. Accordingly, the voltage K(n) at the node K and the voltage P(n) at the node P are in their low level.

At time t6, CLK2 changes from its low voltage level to its high voltage level, and CLK6 is still in its low voltage level. Accordingly, the release circuit (the twelfth transistor T12) is turned on, while the fourth transistor T4 is still in the off state. Meanwhile, the voltage Q(n) at the node Q discharged to in its lowest voltage level, thereby turning both the sixth and seventh transistors T6 and T7 off. Accordingly, the voltage K(n) at the node K and the voltage P(n) at the node P are in their low level.

At time t7, CLK2 changes from its high voltage level to its low voltage level, and CLK6 is still in its low voltage level. Accordingly, the release circuit (the twelfth transistor T12) is turned off, while the fourth transistor T4 is still in the off state. In the case, both the voltage K(n) at the node K and the voltage P(n) at the node P are in their low level.

At time t8, CLK6 changes from its low voltage level to its high voltage level, which turns the fourth transistor T4 from off to on, and CLK2 is still in its low voltage level, indicating that the twelfth transistor T12 is the off state. Additionally, both the sixth and seventh transistors T6 and T7 are turned off. Thus, both the voltage Q(n) at the node Q and the voltage P(n) at the node P are charged to their high voltage level.

At time t9, CLK6 changes from its high voltage level to its low voltage level, which turns the fourth transistor T4 from on to off. Meanwhile, CLK2 is in its low voltage level, indicating that the release circuit (the twelfth transistor T12) is the off state. Accordingly, the voltage K(n) at the node K and the voltage P(n) at the node P are simultaneously drops from its high voltage level to its low voltage level.

At time t10, CLK2 changes from its low voltage level to its high voltage level, and CLK6 is still in its low voltage level. Accordingly, the release circuit (the twelfth transistor T12) is turned on, while the fourth transistor T4 is still in the off state, which causes the voltage K(n) at the node K to further drop to a lower level.

As shown in FIG. 5, the voltage difference K(n)−P(n) between the nodes K and P change between a high voltage level and a low voltage level alternately. For example, in the period of (t8−t2), the voltage difference K(n)−P(n) between the nodes K and P is in the low voltage level, while it in the high voltage level during the period of (t10−t8), and (t8−t2) >>(t10−t8). This ensures that the fifth transistor T5 is turned off (e.g., during (t8−t2)) and on (e.g., (t10−t8)) alternately. Accordingly, the stress imposed on the fifth transistor T5 is substantially reduced, thereby improving the reliability and prolonging the lifetime of the shift register.

FIG. 6 shows timing charts of the shift register stage $S_n$, as shown in FIG. 4, for V1=CLK(6), and V2=CLK(1). Similarly, in operation, the fifth transistor T5 is turned off and on alternately.

Figure 7:
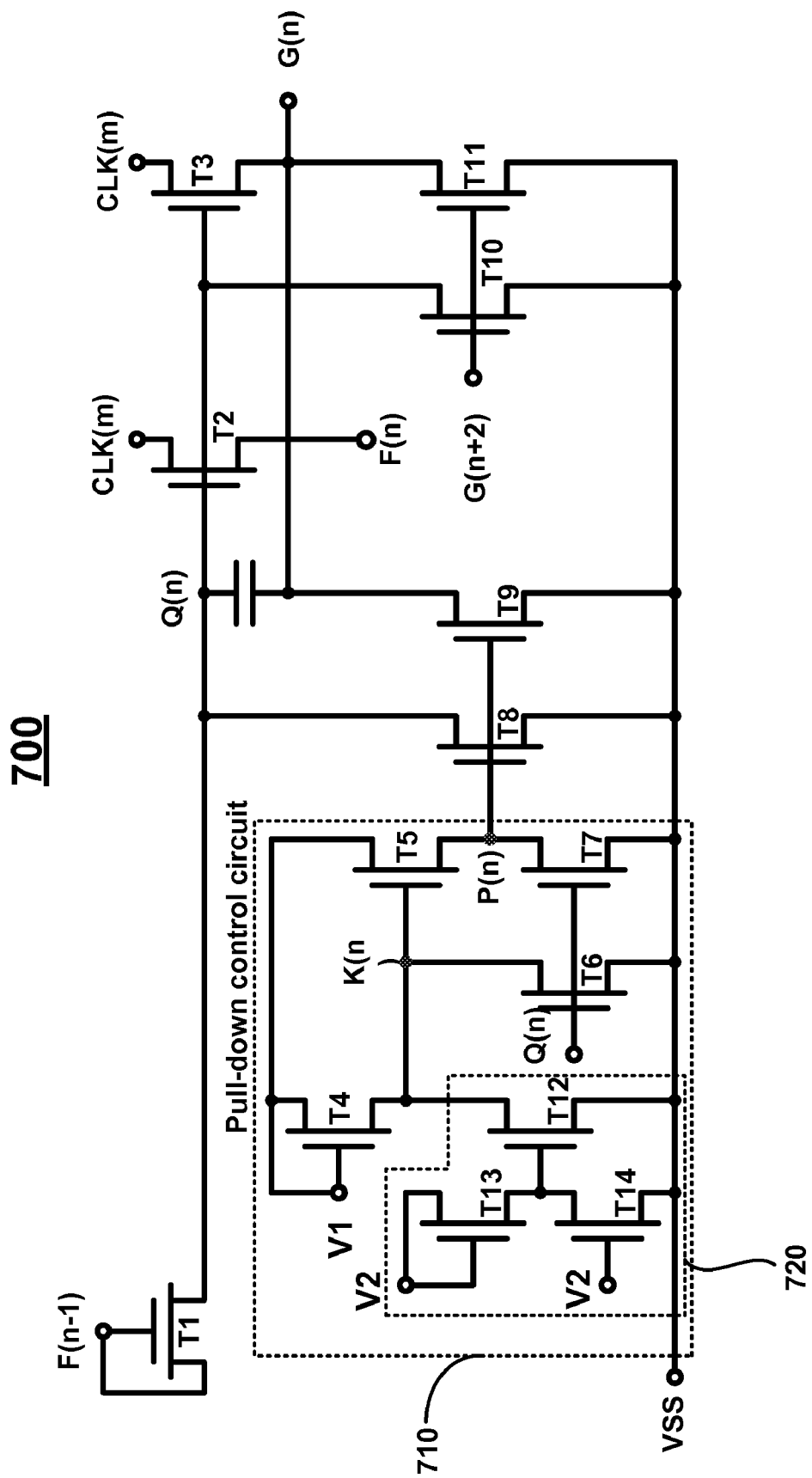
FIG. 7 shows a circuit diagram of a shift register stage according to one embodiment of the present invention.
Figure 8:
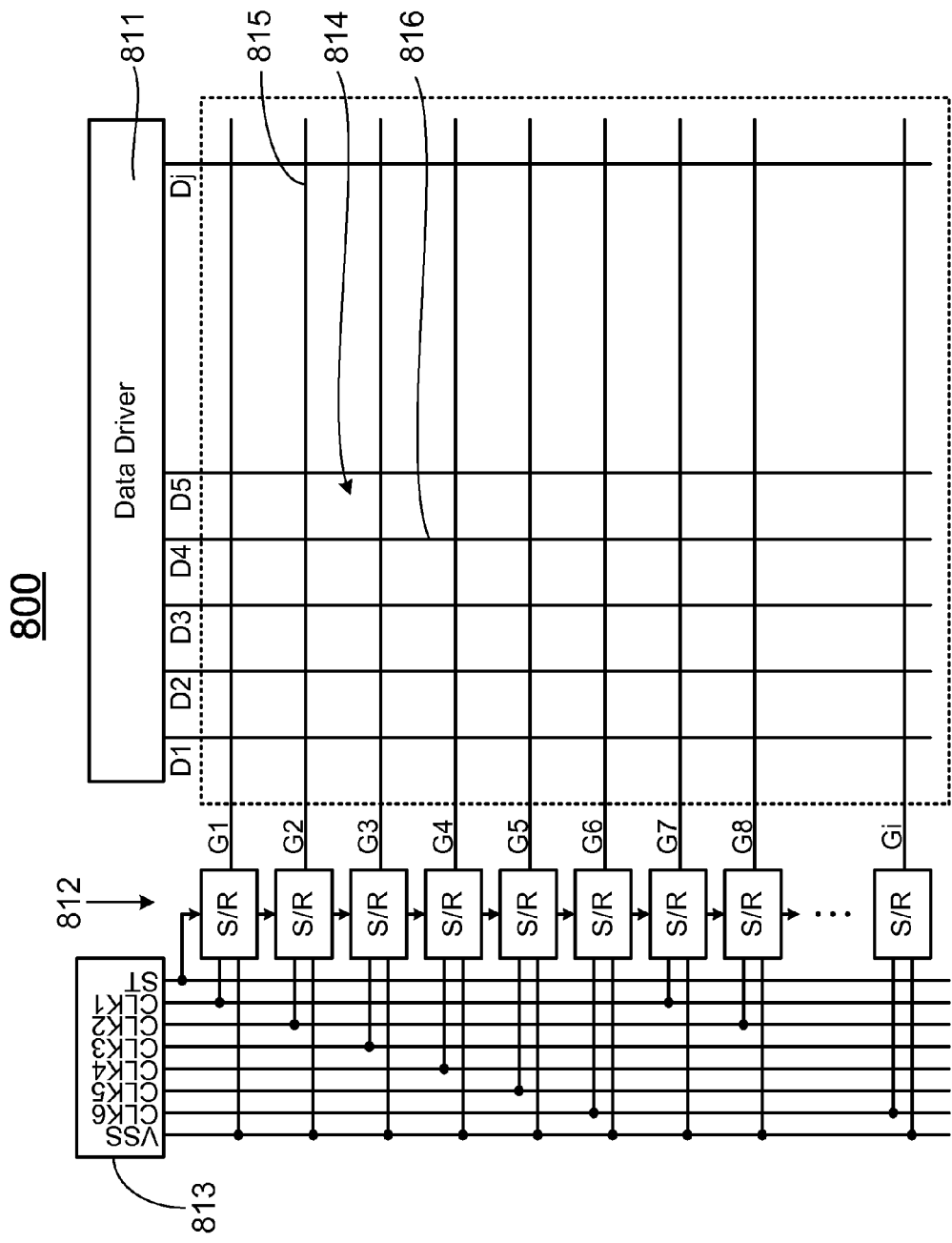
FIG. 8 shows a block diagram of an LCD.
Figure 9:
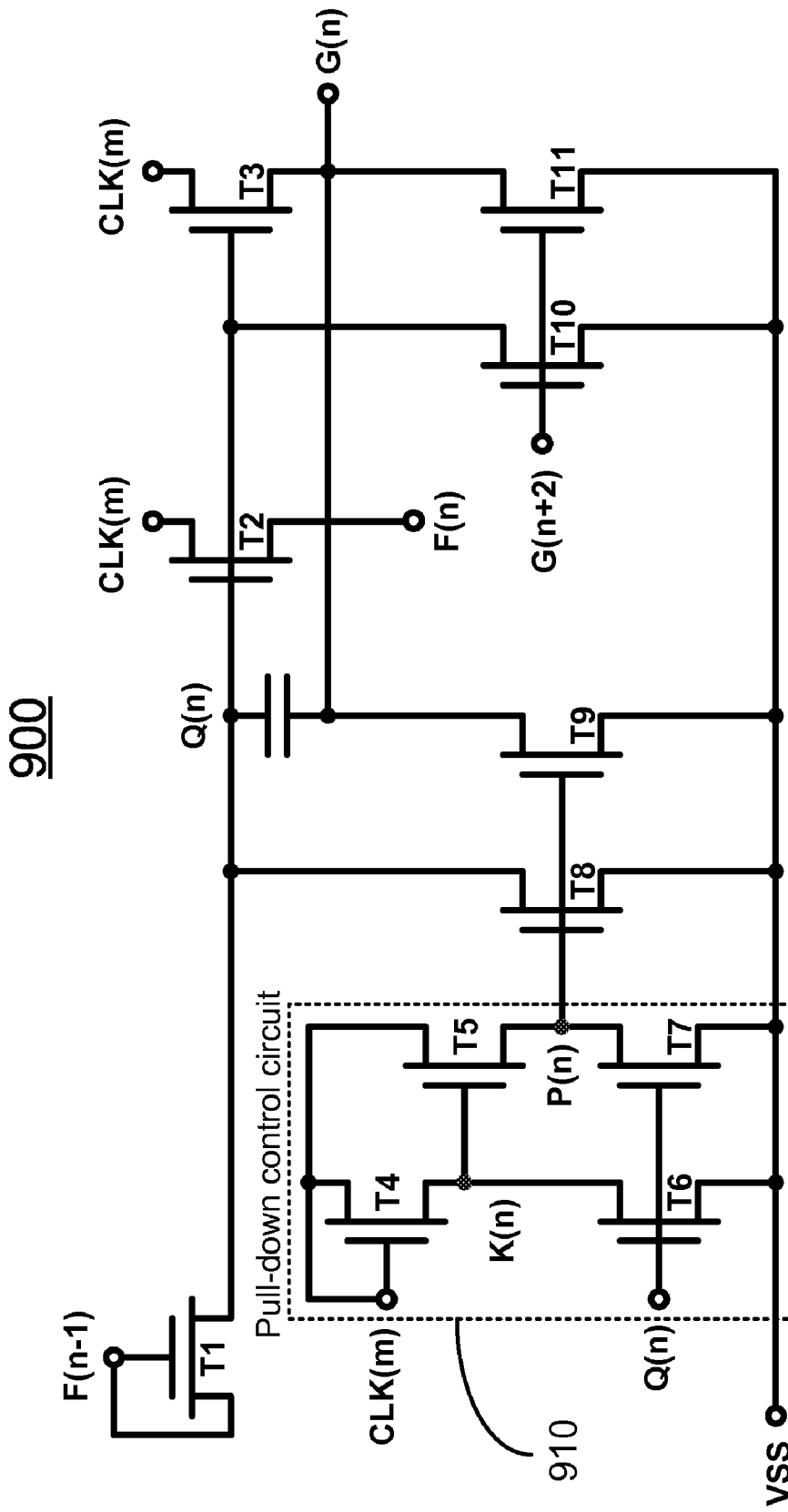
FIG. 9 shows a circuit diagram of a conventional shift register stage.
Figure 10:
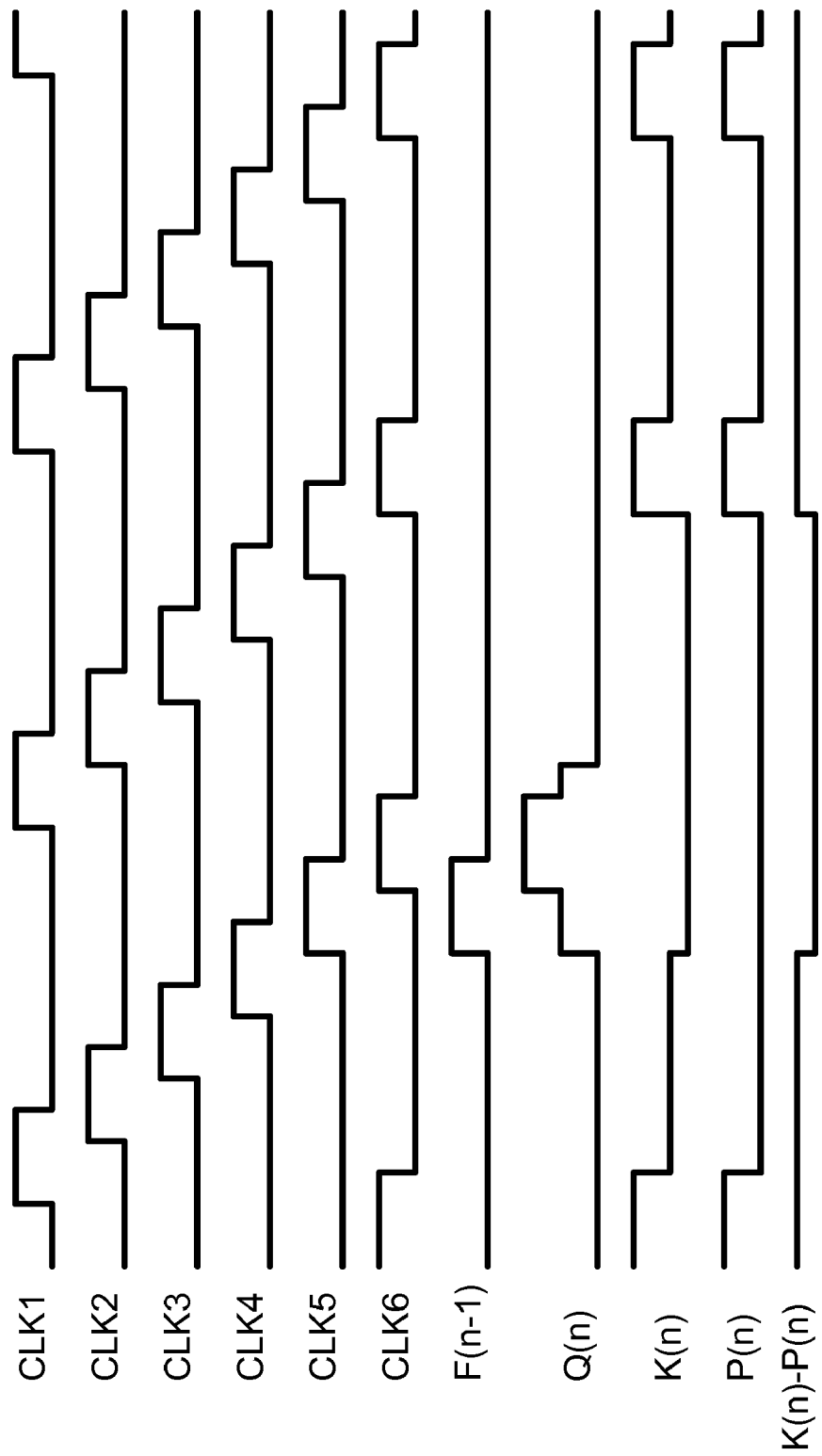
FIG. 10 shows a timing chart of the conventional shift register stage shown in FIG. 9.
Figure 11:
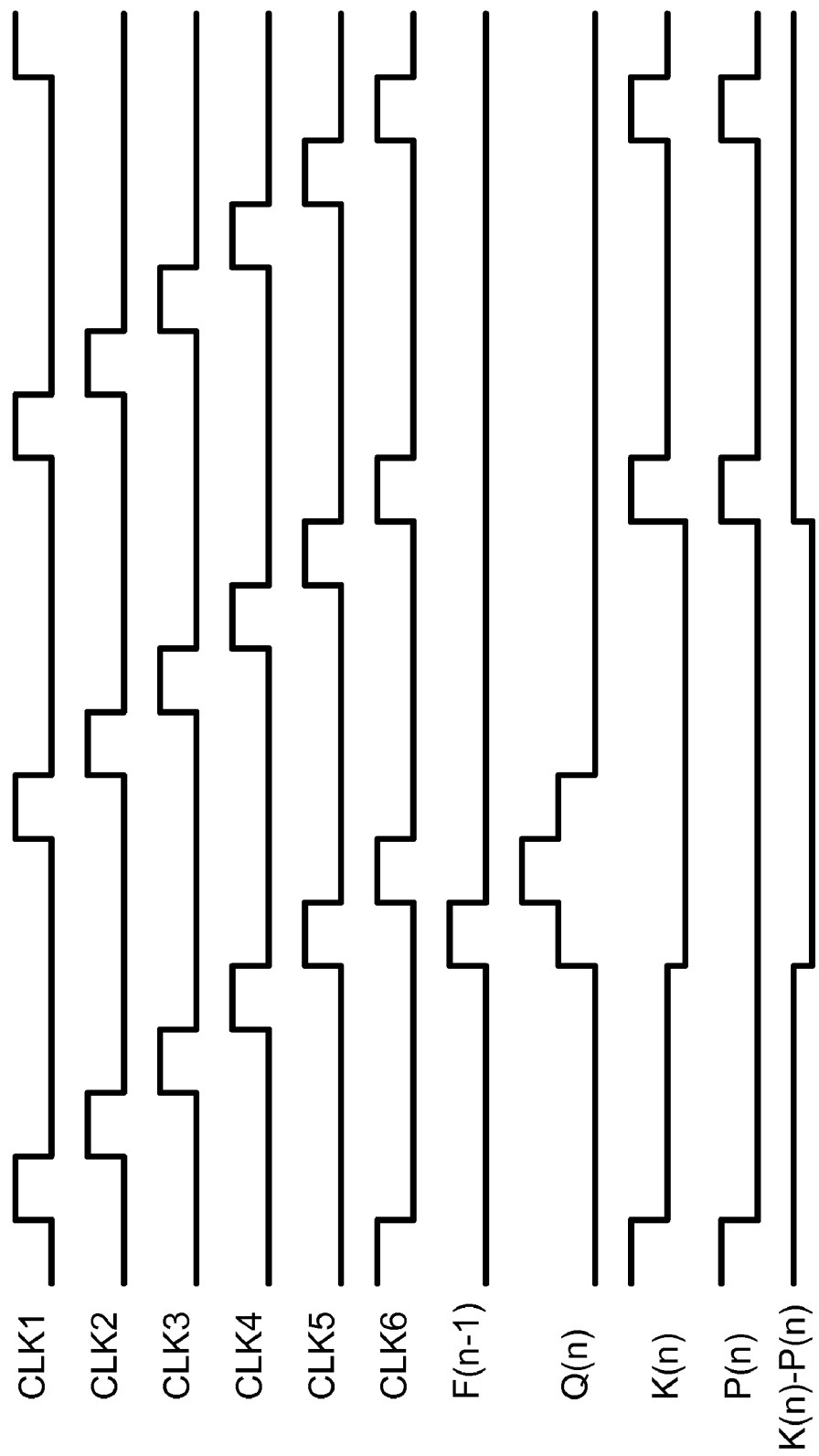
FIG. 11 shows another timing chart of the conventional shift register stage shown in FIG. 9.

FIG. 7 shows another embodiment of a shift register stage 700 according to the present invention. Similar to the shift register stage 300 shown in FIG. 3, the shift register stage 700 also has a pull-down control circuit 710 that includes a release circuit 720. In the exemplary embodiment, the release circuit 720 includes a twelfth transistor T12, a thirteenth transistor T13, and a fourteenth transistor T14. The twelfth transistors T12 has a gate, a drain electrically connected to the source of the fourth transistor T4, and a source electrically connected to the reference voltage VSS. The thirteenth transistors T13 has a gate electrically connected to the second input IN2 for receiving the second control signal V2, a drain electrically connected to the gate, and a source electrically connected to the gate of the transistor T12. The fourteenth transistors T14 has a gate electrically connected to the second input IN2 for receiving the second control signal V2, a drain electrically connected to the gate of the transistor T12, and a source electrically connected to the reference voltage VSS.

According to the present invention, at least one of the first through fourteenth transistors T1-14 comprises a MOS thin film transistor.

In sum, the present invention among other things, recites a pull-down control circuit and a shift register of using same. The pull-down control circuit includes a release circuit and four transistors T4, T5, T6 and T7 electrically coupled to each other. The release circuit is adapted for causing the transistor T5 to be turned on and off alternately, thereby substantially reducing the stress thereon, improving the reliability and prolonging the lifetime of the shift register.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A pull-down control circuit usable in a shift register, comprises:
   (a) an input circuit electrically coupled to a first control voltage, V1;
   (b) a release circuit electrically coupled to the input circuit, a second control voltage, V2, and the reference voltage, VSS;
   (c) a pull-down circuit electrically coupled to the input circuit and the release circuit;
   (d) an output circuit electrically coupled to the input circuit and the pull-down circuit;
   (e) a first input terminal for receiving the first control voltage, V1;
   (f) a second input terminal for receiving the second control voltage, V2; and
   (g) a third input terminal for receiving the reference voltage, VSS,
   wherein the release circuit has a first input terminal electrically connected to the second input terminal, a second terminal electrically connected to a node, K, and a third terminal electrically connected to the third input terminal, and comprises three transistors T12, T13 and T14,
      wherein the transistors T12 has a gate, a drain electrically connected to the second terminal, and a source electrically connected to the third terminal;
      wherein the transistors T13 has a gate electrically connected to the first terminal, a drain electrically connected to the gate, and a source electrically connected to the gate of the transistor T12; and
      wherein the transistors T14 has a gate electrically connected to the first terminal, a drain electrically connected to the gate of the transistor T12, and a source electrically connected to the third terminal;
   wherein the input circuit has a transistor T4 having a gate electrically connected to the first terminal, a drain electrically connected to the gate, and a source electrically connected to the second terminal of the release circuit;
   wherein the pull-down circuit has a transistor T6 having a gate electrically connected to a node, Q, a drain electrically connected to the node K, and a source electrically connected to the third terminal of the release circuit; and
   wherein the output circuit has a transistor T5 having a gate electrically connected to the node K, a drain electrically connected to the drain of the transistor T4, and a source electrically connected to a node, P, and a transistor T7 having a gate electrically connected to the gate of the transistor T6, a drain electrically connected to the node P, and a source electrically connected to the source of the transistor T6.

2. The pull-down control circuit of claim 1, wherein the first control voltage V1, the second control voltage V2 and the reference voltage VSS satisfy the logic relationship of V1 AND V2 AND CLK(m)=0, wherein CLK(m) is one of a plurality of clock signals, {CLK(m)}, m being an integer greater than one.

3. The pull-down control circuit of claim 1, wherein at least one of the transistors T4-T6 and T12-14 comprises a MOS thin film transistor.

4. A shift register, comprising a plurality of stages, wherein each stage comprises the pull-down control circuit of claim 1.

5. A pull-down control circuit usable in a shift register, comprises:
   (a) an input circuit electrically coupled to a first control voltage, V1;
   (b) a release circuit electrically coupled to the input circuit, a second control voltage, V2, and a reference voltage, VSS, wherein the release circuit comprises three transistors T12, T13 and T14,
      wherein the transistors T12 has a gate, a drain electrically connected to a node K, and a source electrically coupled to the reference voltage VSS;
      wherein the transistors T13 has a gate electrically coupled to the second control voltage V2, a drain electrically connected to the gate, and a source electrically connected to the gate of the transistor T12; and
      wherein the transistors T14 has a gate electrically coupled to the second control voltage V2, a drain electrically connected to the gate of the transistor T12, and a source electrically coupled to the reference voltage VSS;
   (c) a pull-down circuit electrically coupled to the input circuit and the release circuit; and
   (d) an output circuit electrically coupled to the input circuit and the pull-down circuit, wherein the output circuit comprises:
      a transistor T5 having a gate electrically connected to the node K, a drain, and a source electrically connected to a node, P; and
      a transistor T7 having a gate electrically connected to a node, Q, a drain electrically connected to the node P, and a source electrically coupled to the reference voltage VSS.

6. The pull-down control circuit of claim 5, wherein the first control voltage V1, the second control voltage V2 and the reference voltage VSS satisfy the logic relationship of V1 AND V2 AND CLK(m)=0, wherein CLK(m) is one of a plurality of clock signals, {CLK(m)}, m being an integer greater than one.

7. The pull-down control circuit of claim 5, wherein the input circuit comprises a transistor T4 having a gate electrically coupled to the first control voltage V1, a drain electrically connected to the gate of the transistor T4 and the drain of the transistor T5, and a source eclectically connected to the node K.

8. The pull-down control circuit of claim 7, wherein the pull-down circuit comprises a transistor T6 having a gate electrically connected to the node Q, a drain electrically connected to the node K, and a source electrically coupled to the release circuit.

9. A shift register, comprising a plurality of stages, wherein each stage comprises the pull-down control circuit of claim 5.

10. A shift register, comprising a plurality of stages, {$S_n$}, n=1, 2, . . . , N, N being a positive integer, wherein each stage $S_n$ comprises:
   (a) a first input, IN1, for receiving a first control signal, V1;
   (b) a second input, IN2, for receiving a second control signal, V2;
   (c) a third input, IN3, for receiving a third control signal, V3;
   (d) a fourth input, IN4, for receiving a fourth control signal, V4;
   (e) a fifth input, IN5, for receiving the fifth control signal, V5;
   (f) a sixth input, IN6, for receiving a pull-up output signal, F(n−1), of the stage $S_{n−1}$;
   (g) a seventh input, IN7, for receiving an output signal, G(n+2), of the stage $S_{n+2}$;
   (h) a first output, OUT1, for outputting an output signal, G(n);
   (i) a second output, OUT2, for outputting a pull-up output signal, F(n);

(j) a first transistor T1 having a gate electrically connected to the sixth input IN6, a drain electrically connected to a node, Q, and a source electrically connected to the gate;

(k) a second transistor T2 having a gate electrically connected to the node Q, a drain electrically connected to the fourth input IN4, and a source electrically connected to the second output OUT2;

(l) a third transistor T3 having a gate electrically connected to the gate of the second transistor T2, a drain electrically connected to the fifth input IN5, and a source electrically connected to the first output OUT1;

(m) a pull-down control circuit having a fourth transistor T4, a fifth transistor T5, a sixth transistor T6, a seventh transistor T7 and a release circuit electrically coupled to each other, wherein the release circuit has a first terminal electrically connected to the second input IN2, a second terminal electrically connected to a node, K, and a third terminal electrically connected to the third input IN3;

wherein the fourth transistor T4 has a gate electrically connected to the first input IN1, a drain electrically connected to the gate, and a source electrically connected to the second terminal of the release circuit;

wherein the fifth transistor T5 has a gate electrically connected to the node K, a drain electrically connected to the drain of the fourth transistor T4, and a source electrically connected to a node, P;

wherein the sixth transistor T6 has a gate electrically connected to a node, Q, a drain electrically connected to the node K, and a source electrically connected to the third terminal of the release circuit; and wherein the seventh transistor T7 has a gate electrically connected to the gate of the sixth transistor T6, a drain electrically connected to the node P, and a source electrically connected to the source of the sixth transistor T6;

(n) an eighth transistor T8 having a gate electrically connected to the node P, a drain electrically connected to the drain of the first transistor T1, and a source electrically connected to the source of the seventh transistor T7;

(o) a ninth transistor T9 having a gate electrically connected to the gate of the eighth transistor T8, a drain electrically connected to the first output OUT1, and a source electrically connected to the source of the eighth transistor T8;

(p) a tenth transistor T10 having a gate electrically connected to the seventh input IN7, a drain electrically connected to the gate of third transistor T3, and a source electrically connected to the source of the ninth transistor T9;

(q) an eleventh transistor T11 having a gate electrically connected to the gate of the tenth transistor T10, a drain electrically connected to the first output OUT1, and a source electrically connected to the source of the tenth transistor T10; and (r) a capacitor having one terminal electrically connected to the node Q and the other terminal electrically connected to the drain of the ninth transistor T9.

11. The shift register of claim 10, wherein the plurality of stages $\{S_n\}$ is electrically coupled to each other in serial such that the six input IN6 of the n-th stage $S_n$ is electrically connected to the second output OUT2 of the (n−1)-th stage $S_{n-1}$, for receiving a corresponding pull-up output signal F(n−1) therefrom, and the seventh input IN7 of the n-th stage $S_n$ is electrically connected to the first output OUT1 of the (n+2)-th stage $S_{n+2}$, for receiving a corresponding output signal G(n+2) therefrom.

12. The shift register of claim 10, wherein the release circuit comprises a twelfth transistor T12 having a gate, a drain and a source electrically connected to the first terminal, the second terminal and the third terminal, respectively.

13. The shift register of claim 12, wherein the release circuit comprises a twelfth transistor T12, a thirteenth transistor T13, and a fourteenth transistor T14, wherein the twelfth transistors T12 has a gate, a drain electrically connected to the second terminal, and a source electrically connected to the third terminal;

wherein the thirteenth transistors T13 has a gate electrically connected to the first terminal, a drain electrically connected to the gate, and a source electrically connected to the gate of the transistor T12; and wherein the fourteenth transistors T14 has a gate electrically connected to the first terminal, a drain electrically connected to the gate of the transistor T12, and a source electrically connected to the third terminal.

14. The shift register of claim 13, wherein at least one of the first through fourteenth transistors T1-14 comprises a MOS thin film transistor.

15. The shift register of claim 10, wherein the third control signal V3 is a reference voltage VSS, wherein each of the first control signal V1, the second control signal V2, the fourth control signal V4, and the fifth control signal V5 is a corresponding one of a plurality of clock signals, {CLK(m)}, m being an integer greater than one.

16. The shift register of claim 15, wherein each of the plurality of clock signals {CLK(m)} is characterized with a high voltage level and a low voltage level alternately in a frequency.

17. The shift register of claim 15, wherein the fourth control signal V4 and the fifth control signal V5 are substantially identical to each other.

18. The shift register of claim 17, wherein the first control voltage V1, the second control voltage V2 and the supply voltage VSS satisfy the logic relationship of V1 AND V2 AND CLK(m)=0.

* * * * *